United States Patent [19]

Herrell et al.

[11] Patent Number: 4,833,766
[45] Date of Patent: May 30, 1989

[54] METHOD OF MAKING GAS HEAT EXCHANGER

[75] Inventors: Dennis J. Herrell, Austin, Tex.; Omkarnath R. Gupta, Englewood, Colo.; Claude Hilbert, Austin, Tex.

[73] Assignee: Microelectronics and Computer Technology Corporation, Austin, Tex.

[21] Appl. No.: 222,489

[22] Filed: Jul. 21, 1988

Related U.S. Application Data

[62] Division of Ser. No. 92,255, Sep. 2, 1987.

[51] Int. Cl.$^4$ .............. B21D 53/00; B23P 13/04
[52] U.S. Cl. .................. 29/157.3 A; 29/157.3 D; 29/558
[58] Field of Search .............. 29/157.3 R, 157.3 A, 29/157.3 D, 557, 558; 174/16 R, 16 HS; 357/81, 82; 363/141; 165/80.3, 122, 126, 170, 185; 361/381, 383, 382, 384, 385, 386, 387, 388

[56] References Cited

U.S. PATENT DOCUMENTS

| | | | |
|---|---|---|---|
| 2,988,033 | 6/1961 | Gapp | 29/157.3 D |
| 3,313,339 | 4/1967 | Coe | 165/80.3 |
| 4,449,164 | 5/1984 | Carlson et al. | 361/384 |
| 4,535,841 | 8/1985 | Kok | 165/80.3 X |
| 4,653,163 | 3/1987 | Kuwahara et al. | 29/558 X |

Primary Examiner—Timothy V. Eley
Attorney, Agent, or Firm—Fulbright & Jaworski

[57] ABSTRACT

A plurality of thin flat parallel positioned thermal conductive fins adapted to be connected to an object and a gas passageway passing between adjacent fins and extending between the top of the fins and opposite sides. Gas guides are positioned between adjacent fins at the center of the plurality of fins and redirect the outlet end of the passageways normal to the inlet ends of the passageways. Alternately positioned fins face in opposing directions. The fins may be integrally formed or individually formed. A thermal conductive base may be provided at the bottom of the plurality of fins for connection to an electronic package.

4 Claims, 7 Drawing Sheets

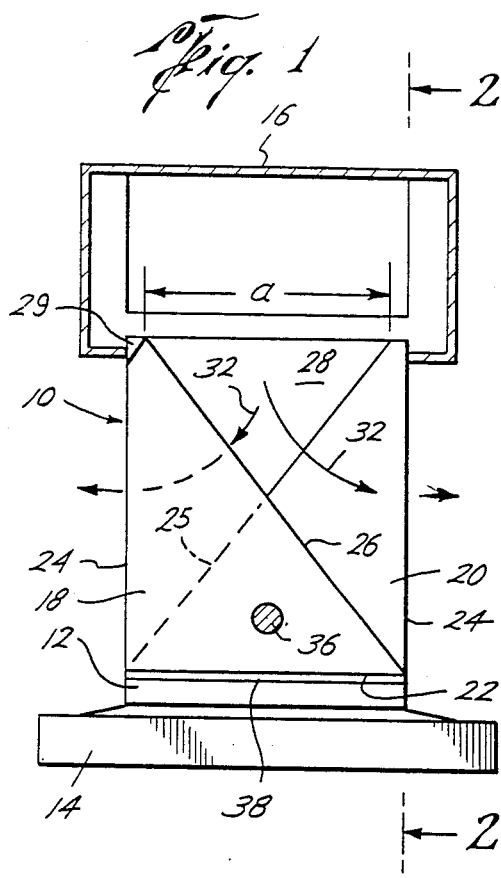
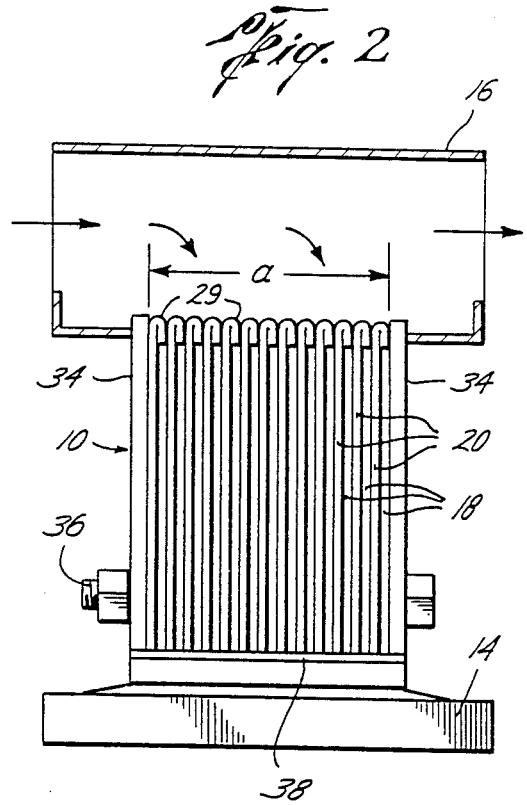
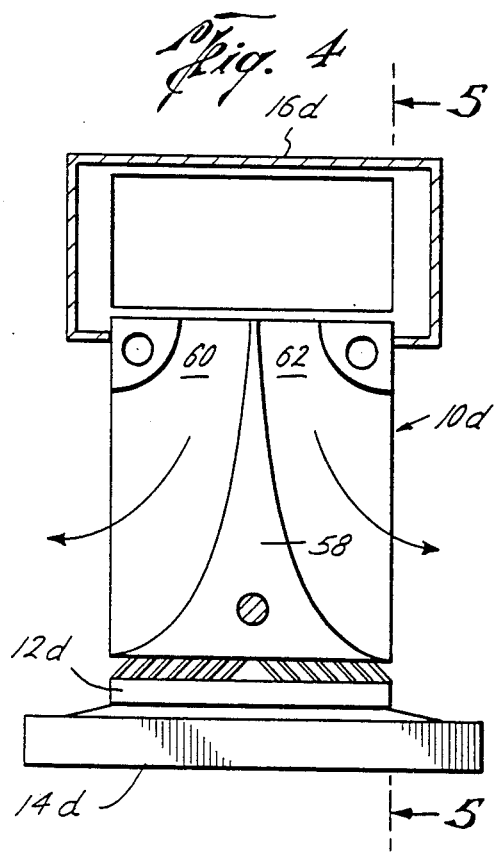
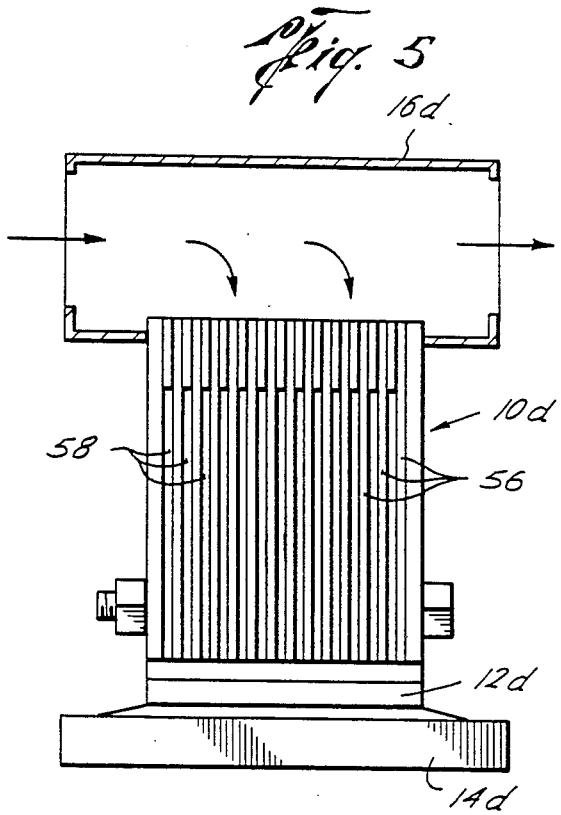

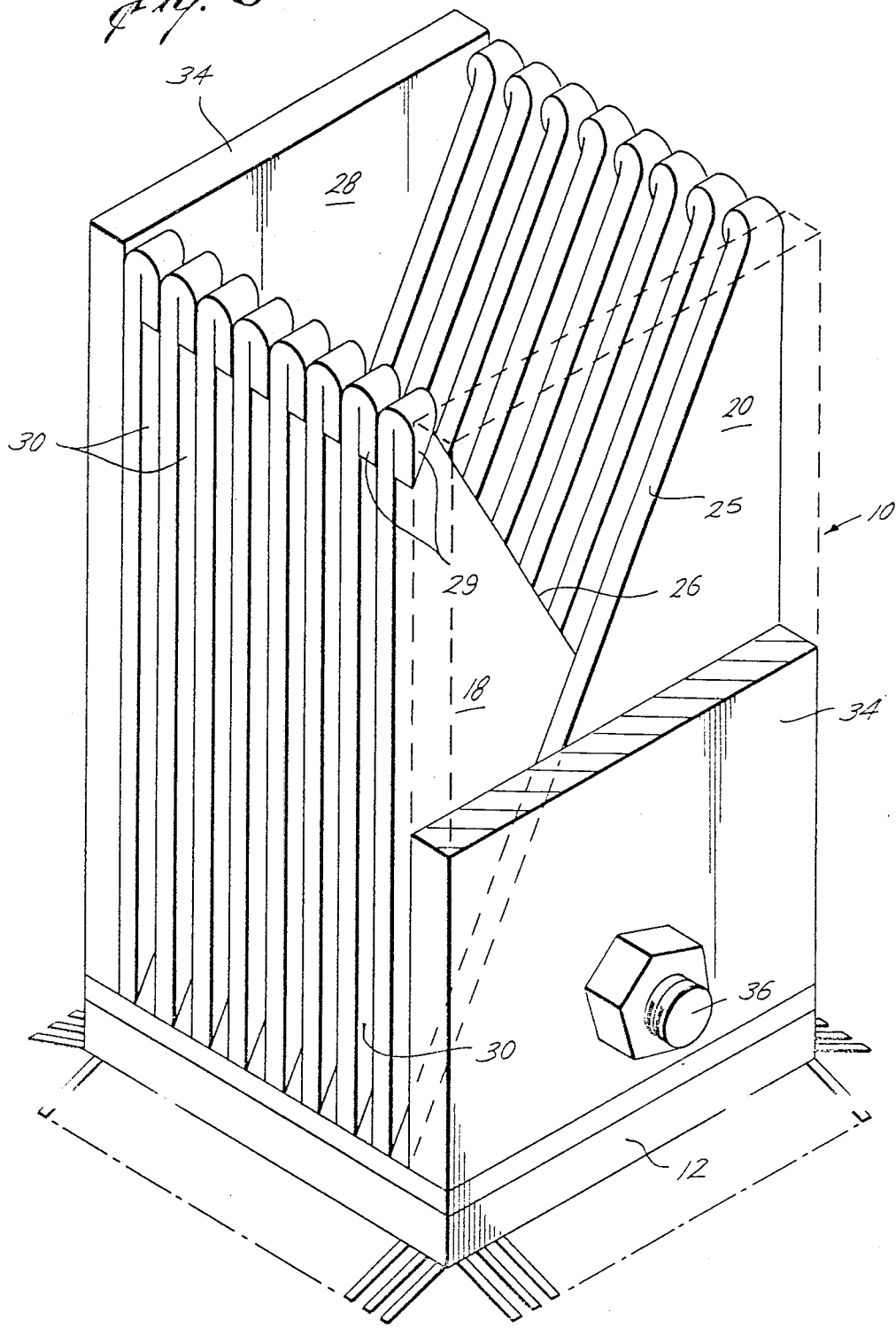

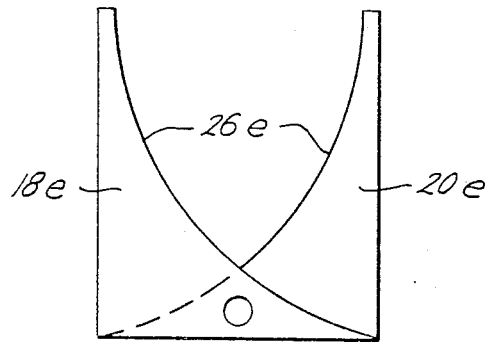
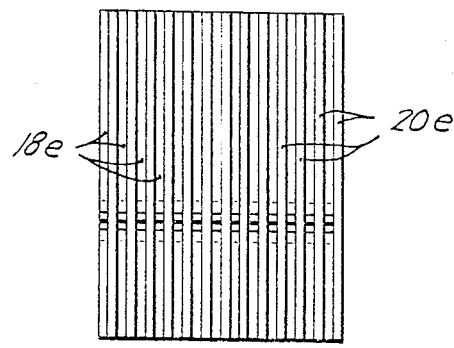
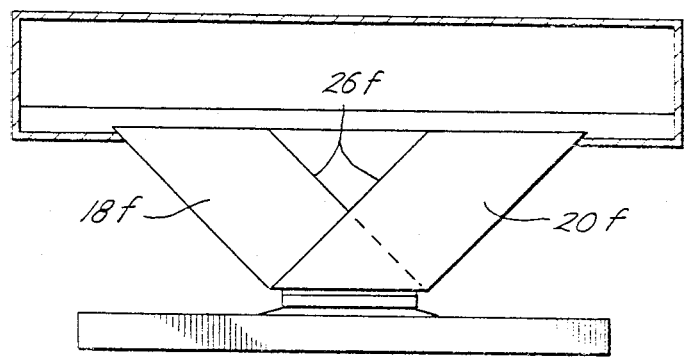
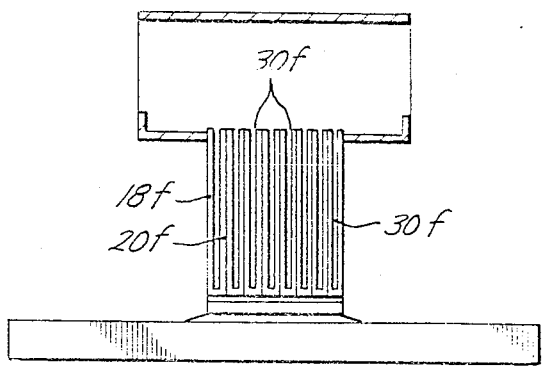

4,833,766

METHOD OF MAKING GAS HEAT EXCHANGER

This is a division of application Ser. No. 092,255, filed Sept. 2, 1987.

BACKGROUND OF THE INVENTION

The present invention is directed to a gas heat exchanger for transferring heat or cold into or out of an object. While useful in other applications, the present invention is particularly useful in cooling electronic components. As disclosed in U.S. Pat. Nos. 4,296,455, 4,449,164 and 4,489,363, it is desirable to provide an air cooled heat sink for dissipating the heat generated by an electronic package. Otherwise, generation of heat could cause changes in the electrical performance and reduce the reliability and useful life of the electronics.

The present invention is directed to a gas heat exchanger and method of manufacture for heating or cooling an object which has a high heat transfer capability, low noise, low gas pressure requirements, which is modular, can be removed for servicing, and which can be manufactured by simple manufacturing procedures using low cost conventional materials.

SUMMARY

One object of the present invention is the provision of a gas heat exchange for heating or cooling an object which includes a plurality of thin flat parallel positioned thermal conductive fins with a narrow gas passageway between fins extending between the top of the fins and both sides of the fins. One end of the passageway may be an inlet and the second end of the passageway may be an outlet. Although gas flow through the heat sink may be in either direction, that is, gas flow may flow from the one end of the passageway to the second end or vice-versa without significantly affecting the thermal efficiency of the apparatus. Gas guide means are positioned between each of the adjacent fins at the center of the plurality of fins and redirects the outlet end of the passageway normal to the inlet end of the passageway.

Yet a still further object of the present invention is wherein the alternately positioned fins face in opposite directions forming a portion of a gas passageway between the tops of the fins. The fins may be various shapes such as triangular, or parallelogram shaped or have a curved gas guide surface.

Still a further object of the present invention is wherein the guide means increases in width from its top to its bottom for redirecting the gas. The guide means may be formed by a portion of the fins.

Still a further object of the present invention is the provision of a gas cooled heat sink for cooling an electronic package which includes a plurality of thin flat parallel adjacently positioned thermal conductive cooling fins for connection to an electronic package. The fins have a bottom and a top and two sides and one of the sides extends downwardly and outwardly to the bottom. Alternately positioned fins face in the opposite directions with said one sides of adjacent fins facing each other thereby forming a gas passageway between fins extending between the top of the fins and the two sides of the heat sink. One end of the passageway is an inlet and the second end of the passageway is an outlet. The one sides of the fins form a gas guide means redirecting the outlet end of the passageway normal to the inlet end of the passageway.

Another object of the present invention is wherein the top of the cooling fins are folded downwardly for providing support between adjacent fins and forming an edge for the passageways.

Still a further object of the present invention is wherein the fins may be manufactured individually, connected together, or manufactured in an integral unit.

In another embodiment of the invention a plurality of side-by-side flat thin parallel positioned and spaced thermal conductive rectangular shaped cooling fins are provided with a gas passageway extending between each adjacent fin between the top and both sides of the fins with gas guide means positioned between and in the middle of adjacent fins. The gas guide increases in width from its top to its bottom and redirects the outlet end of the passageway normal to the inlet end of the passageway.

Another object of the present invention is the method of forming fins for a gas cooled heat sink which includes cutting a plurality of right-angle triangle shaped fins out of a thermally conductive material in which adjacent fins are connected adjacent corresponding sides of each fin, folding the top of each of the triangular shaped fins opposite said connected sides over and back, and folding the adjacent fins along their connection to each other towards each other in a direction whereby adjacent fins are reversed relative to each other.

Another object is the method of making parallelogram fins which includes forming a double size parallelogram shaped fin, and folding the fin in the middle to form double fins extending opposite to each other. Preferably a space is provided between the double fins.

Still a further object of the present invention is the method of forming a heat sink for cooling the electronic package which includes removing material from one side of a solid piece of thermal conductive material at a plurality of spaced first positions leaving a cross-sectional area having a bottom, a top and a side which extends downwardly and outwardly to the bottom. The method further includes removing the material from the side opposite from the one side at a position between each of the plurality of first positions to leave a second cross-sectional area similarly shaped to the first cross-sectional area but reversed.

Yet a further object is the provision of a low pressure, low noise, efficient heat exchange array.

Other and further objects, features and advantages will be apparent from the following description of presently preferred embodiments of the invention, given for the purpose of disclosure, and taken in conjunction with the accompanying drawings.

BRIEF DESCRIPTION OF THE DRAWINGS

FIG. 1 is an elevational view, in cross section, of the preferred embodiment of the present invention, FIG. 2 is a cross-sectional view taken along the line 2—2 of FIG. 1, FIG. 3 is an enlarged perspective view, partly in cross section, of the heat sink of FIGS. 1 and 2, FIG. 4 is an elevational view, partly in cross section, of another embodiment of the present invention, FIG. 5 is a cross-sectional view taken along the line 5—5 of FIG. 4, FIG. 15 is an elevational view of another embodiment of differently shaped cooling fins, FIG. 16 is a cross-sectional view taken along the line 16—16 of FIG. 15, FIG. 17 is an elevational view of an embodiment of parallelogram shaped fins, FIG. 18 is a cross-sectional view taken along line 18—18 of FIG. 17.

DESCRIPTION OF THE PREFERRED EMBODIMENTS

Figure 6:
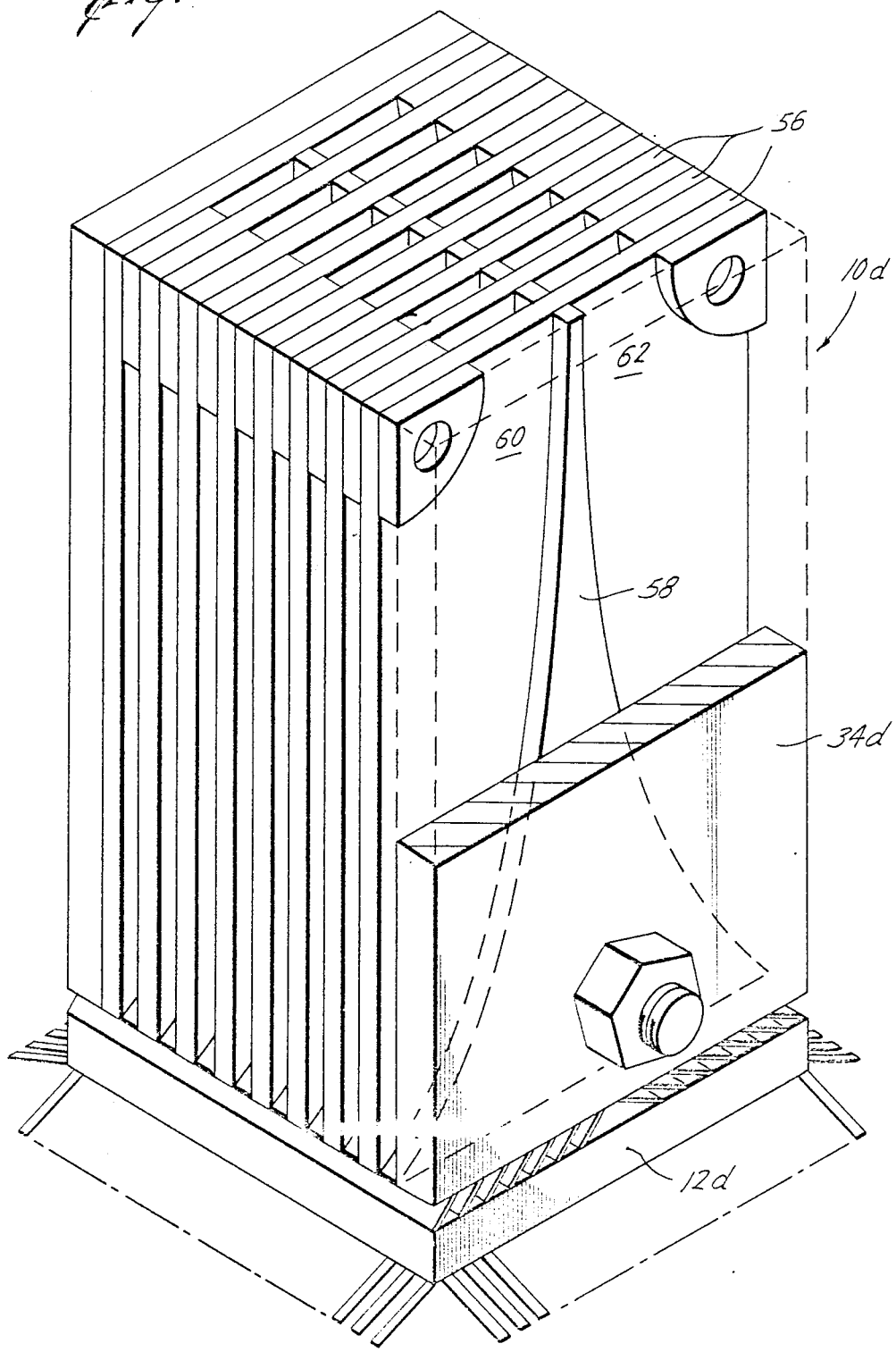
FIG. 6 is an enlarged perspective elevational view of the heat sink of FIGS. 4 and 5.
Figure 7:
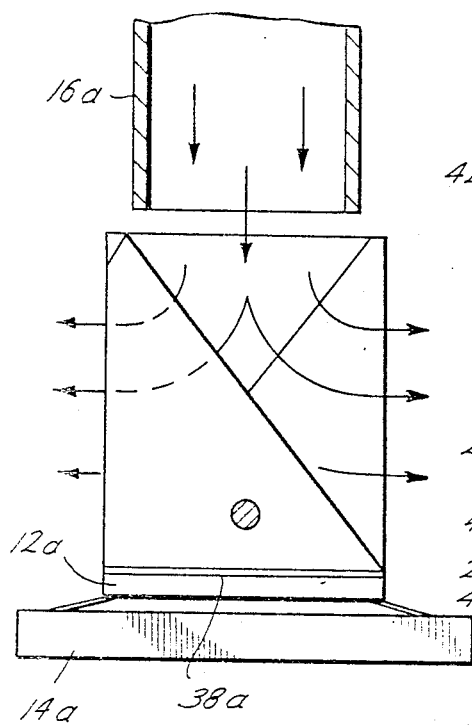
FIG. 7 is an elevational view, in cross section, of another embodiment of the present invention.

While the present invention will be described, for purposes of illustration only, as a gas cooled heat sink for cooling an electronic package, the gas heat exchanger is useful in other applications for either heating or cooling an object and two or more of the heat exchangers may be used in a closed loop system.

Referring now to the drawings, and particularly to FIGS. 1, 2 and 3, the reference numeral 10 generally indicates the microlaminar heat sink of the present invention which is attached to an electronic package such as an integrated circuit chip package 12 which in turn is supported from a substrate 14. The heat sink 10 preferably receives a cooling gas such as air from a duct 16 which may be connected to supply a cooling gas to one or more heat sinks 10 although the flow of cooling gas through the sink 10 may be reversed if desired.

The heat sink 10 includes a plurality of thin flat parallel positioned thermally conductive cooling fins 18 and 20. The fins 18 and 20 may be of any suitable thermal conductive materials such as copper, aluminum, berylium oxide or aluminum oxide. Aluminum provides a significant weight reduction (about 70%) for a small performance penalty (less than 10%). Preferably the fins 18 and 20 are identical for ease of manufacture. Each of the fins 18 and 20 include a bottom 22, a first side 24, and a second side 26 and a top 29. The side 26 extends downwardly and outwardly to the bottom 22. In the embodiment of FIGS. 1-3, the fins 18 and 20 are in the shape of right angle triangles and preferably have a high aspect ratio, that is, the side 24 is longer than the bottom 22. As an alternative the sides 26 may be curved or circular similar to the shapes shown in FIGS. 11, 12, 15 and 16.

Alternately positioned fins are reversed so as to face in opposite directions to provide a gas passageway 30 extending between the top or duct 16 and the two sides 24 between adjacent fins 18 and between adjacent fins 20. The passageways 30 include an end 28 at the top 29 and second ends between the adjacent fins 18 and adjacent fins 20 at sides 24. The second sides 26 or hypotenuses are directed to face inwardly towards each other thereby forming a gas guide means (consisting of solid triangle prism 25) at the center of the sink 10 which redirects the second ends of passageways 30 normal to the first end 28 of the passageways 30. That is the gas guide 25 (triangular in cross section) increases in width from its top to its bottom. The air flow through the heat sink 10, if from end 28 to the sides 24, is indicated by the direction of the flow arrows 32.

The tips of the tops 29 of each of the fins 18 and 20 are folded over or alternately dipped in epoxy, etc., to provide supports for the tops 29 and to assist in the ducting of the cooling gas flow between the fins 18 and 20.

For example only, each of the fins 18 and 20 may be 5 mils thick and the sink 10 may comprise eighty fins for a 400×400 mil area heat sink with a height of 700 mils. However, the thickness and exact dimensions of the heat sink 10 can be varied in order to optimize the heat exchange and to minimize the air flow resistance. However, the present invention has a modular feature of increasing the number of fins as the size of the base increases. This feature allows the sink to be sized proportionally to the surface to be cooled which is also approximately proportional to the amount of heat in most applications.

In order to duct the cooling gas through the heat sink 10, an end plate 34 is provided at each end of the plurality of fins 18 and 20 and is connected to the duct 16 for directing the cooling gas through the fins 18 and 20.

The end plates 34 and fins 18 and 20 may be secured together with any suitable securing means such as a bolt 36. Alternately, the assembly can be soldered together.

Preferably, a thermal conductive base 38 may be connected to the bottom 22 of the fins 18 and 20 and the bottom surface thereof may be attached to the electronic package 12 by any suitable means. For example, the bottom surface may be machined to an accurate finish and soldered to the package 12. Alternatives include the use of microcapillary attachment through the use of microcapillaries machined to the underside of the base 38 or the back of the package 12. Furthermore, the sink 10 can be pressed against the back of the package 12 for a simple pressure contact and thermal conducting greases can also be used. In short, all methods of attachment insuring low thermal impedance can be used. Conventional systems use a compliant or conformable interface in multi-chip applications where the surfaces of the chips do not -form a planar surface (a common problem). The present invention does not require a compliant interface since the heat sink 10 may be directly mounted on the chip 12.

The structure of the present invention provides several considerable advantages. First, the cooling air flowing through the gas passageways 30 produces a lower pressure drop and hence the gas moving system is required to be less powerful than conventional systems. Secondly, the average velocity of the air through the narrow passageways 30 is reduced. This reduces restrictions to flow at both the inlet and the outlet of the passageways 30 and hence the acoustical noise generated. The structure of FIGS. 1-3 has provided adequate cooling for components running at 30 watts with only a gas pressure of 3 inches of water required at an air flow rate of about 57 liters per minute. A thermal resistance of 1.7° centigrade per watt was achieved for a heat sink base of 0.66 square centimeters consisting of 46 fins each 7 mils wide and spaced 7 mils apart with a height of 1.2 cm. This performance is equivalent to about 1.2° centigrade temperature rise per watt of power dissipated per square centimeter, an achievement unheard of for such a simple, low cost air cooled heat sink.

Calculations indicate that the present microlaminar heat sink will provide excellent performance as an air cooler. At an operating pressure of ten inches of water and an air flow of about six cfm the heat sink 10 itself offers a thermal resistance of less than 0.6 K/W. This corresponds to a temperature rise of only 30 Kelvin for a 50 watt chip, which would then add to the intrinsic temperature rise of about 10 Kelvin to yield a 40° temperature rise of the heat producing junctions on a chip over ambient. For the same area the efficiency of a triangular fin such as 18 and 20 is greater than that of a standard rectangular fin because more of its area is close to its base. For thin fins and spaces 30, the air viscosity reduces the flow rate drastically and increases caloric resistance; for wider spaces 30 and fins, the reduced fin surface area as well as the increased boundary layer thickness increases the convective heat transfer resistance. Calculations indicate that the optimum fin thickness may be 10 mils and in such cases with an applied air pressure of one inch of water the total thermal resistance of the heat sink is predicted to be 1.5 K/W with an air flow rate of 2.0 cfm.

Other and further embodiments and modifications may be provided and their method of manufacture which will be described hereinafter where like parts corresponding to those in FIGS. 1-3 are similarly numbered with the addition of the suffix "a," "b," "c," "d," "e," and "f," respectively.

Figure 8:
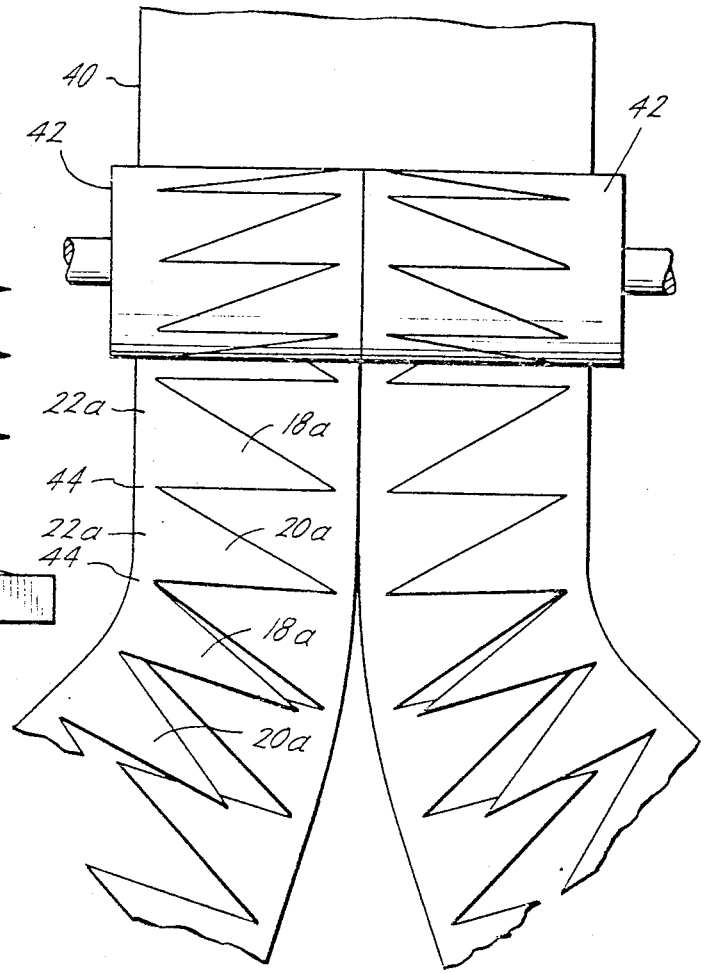
FIGS. 8 and 9 are schematic views illustrating the steps and the method of making the heat sink of FIG. 7.
Figure 9:
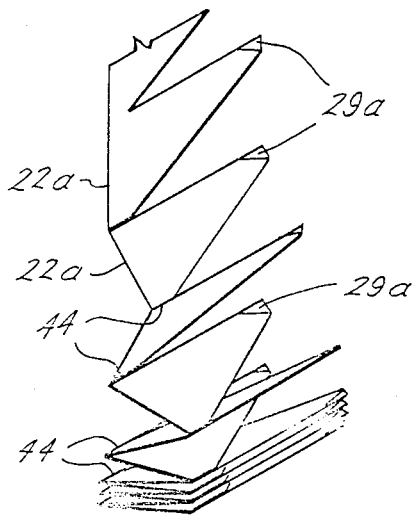
Figure 10:
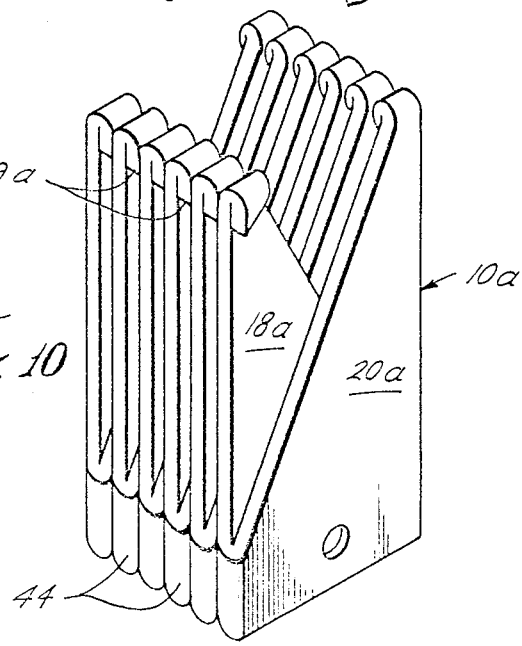
FIG. 10 is a perspective view in elevation of the heat sink of FIG. 7.

Referring now to FIGS. 7, 8, 9 and 10, a method of manufacturing and a modified version of the heat sink is shown. Referring first to FIG. 8, a sheet of thermal conductive material 40, such as copper is provided, in which one or more cutters 42 cut the sheet into a plurality of right-angled triangle shaped fins 18a and 20a with the adjacent fins 18a and 20a being connected adjacent their bottoms 22a by a connection 44. Thereafter, as best seen in FIG. 9, the tips of the tops 29a are folded over and back towards the bottoms 22a and the adjacent fins 18a and 20a are folded along the connections 44 towards each other in a direction whereby adjacent fins 18a and 20a are reversed relative to each other to form the heat sink 10a as shown in FIG. 10 which then may be suitably connected to a chip 12a and receives a cooling gas from a duct 16a and function similarly to that described in connection with FIGS. 1-3.

Figure 11:
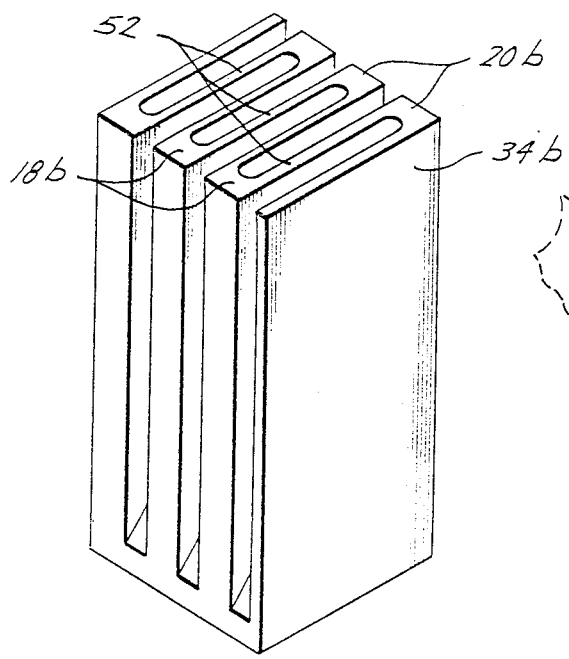
FIG. 11 is an elevational perspective of another embodiment of the present invention.
Figure 12:
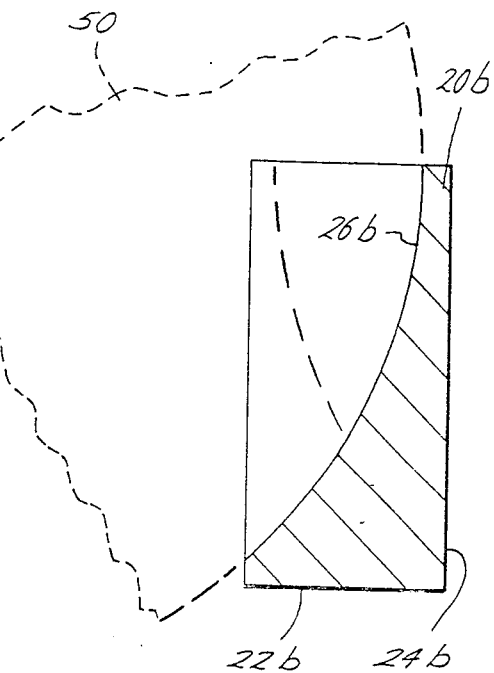
FIG. 12 is an elevational view in cross section illustrating the method of manufacture of the heat sink of FIG. 11.

Referring now to FIGS. 11 and 12, another embodiment of the heat sink of the present invention is shown as sink 10b which is made out of an integral piece of thermally conductive material in which fin cross sections 18b and 20b are formed therein by utilizing a suitable saw blade 50 to create the oppositely directed fins having a circular side 26b to provide oppositely directed air outlet passageways. In this case, because of the method of manufacture, a rectangular wall 52 is created between each adjacent fin section.

Figure 13:
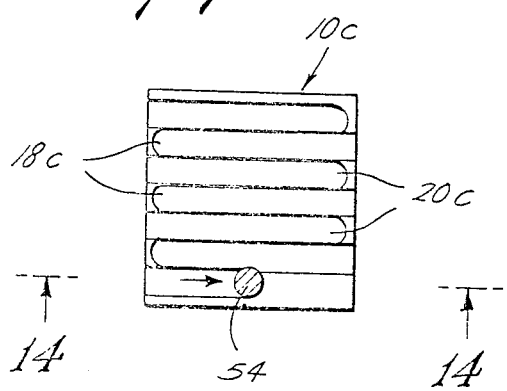
FIG. 13 is a top elevational view illustrating the manufacture of another embodiment of the present invention.
Figure 14:
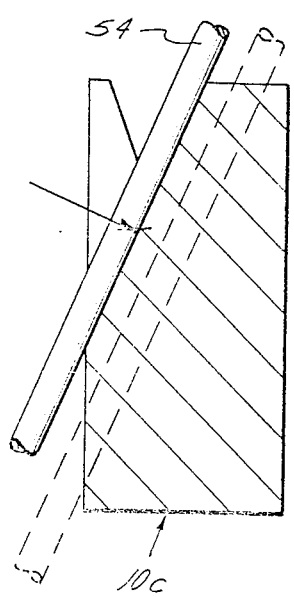
FIG. 14 is a cross-sectional view taken along the line 14—14 of FIG. 13.

Referring now to FIGS. 13 and 14, another embodiment 10c of the heat sink is shown in which the fins 18c and 20c are manufactured out of a solid piece of material by the use of a heating element 54 which by movement in a series of parallel alternating paths at opposite sides of the sink 10c creates an integral heat sink 10c having similar characteristics to those of FIGS. 7-11 by providing right-angled triangular shapes facing in reversing directions and interconnected at their edges.

The microlaminar heat sink of the present invention can be designed with other form factors and materials. It may be desirable to match the thermal expansion of the chip 12d and the heat sink 10d of FIGS. 4, 5 and 6 with a suitable material, such as silicon or molybdenum. The heat sink 10d of FIGS. 4, 5 and 6 may be constructed of a plurality of copper clad tapes or printed circuit board like material where the insulated material is patterned and removed by etching, etc. In this design the copper provides the heat sink and the insulator (polyimide, board material, etc.) provides for optimum ducting of the incoming cooling gas. The gas flows through the heat sink 10d in a laminar fashion. Thus, such a process provides a plurality of side-by-side parallel positioned and spaced rectangularly shaped copper cooling fins 56 and spacer means 58 positioned between and in the middle of adjacent fins 56. The top of the sink 10b is connected to an air duct 16b and the spacer means 58 includes first 60 nd second 62 passageways extending from the top of the fins to opposite sides of the fins 58. Preferably, the passageways 60 and 62 are curved from the top of the fins downwardly into a horizontal direction for directing the cooling air away from the electronic chip package 12d.

Referring now to FIGS. 15 and 16 a modification is provided in which the fins 18e and 20e may be substituted in FIGS. 1-3 for fins 18 and 20. This embodiment is a minor variation of FIGS. 1-3 in that the only difference is that the sides 26e are now curved and in this case made circular. This structure provides for a somewhat smoother gas flow transition from the inlet to the outlet direction and hence provides a still lower pressure drop and less turbulence and noise. This particular embodiment also uses somewhat less materials which reduces cost and weight and has less fin overlap at the bottom of the heat sink. Such a structure will reduce the conduction resistance through the bottom part a little and thus will provide a slightly better performance for a given size.

The foregoing embodiments of a microlaminar air cooled sink provides a very efficient, compact and low cost heat sink which enables the removal of more power than previously thought possible with air cooling. However, the noise generation and high pressure requirements for the air mover were undesirable in some applications. Another embodiment of the present invention is shown in FIGS. 17 and 18 in which case the fins 18f and 20f are parallelogram shaped in which each parallelogram includes a bottom, top and two sides and one of the sides extends downwardly and outwardly to the bottom. For example, the sides may be approximately 45° relative to the bottom. The heat sink 10f incorporates the excellent cooling performance of the earlier embodiments by utilizing a multitude of thin fins 18f and 20f spaced by gas passageways extending between the top and exiting horizontally through the passageways to each side. However, in order to lower the pressure requirements, the heat sink 10f is not as compact as the heat sink 10 of FIGS. 1-3. The parallelogram shaped fins 18f and 20f have a greater surface area than the fins 18 and 20 of FIGS. 1-3, and the gas passageways are larger. For example, the gas passageways in the embodiment 10f are preferably twice as wide as the thickness of the fins. This additional gas passage area provides an increased inlet and outlet cross-sectional areas for the air flow. This decreases the air velocity substantially and hence reduces the amount of noise generated. The fins 18f and 20f may be formed by any suitable manufacturing method as previously described. One suitable method is cutting a desired thickness of thermal conductive material such as copper into double sized fins, that is, a fin which is twice the combined length of the fins 18f and 20f. The double size fin was then folded in the middle to form the two fins 18f and 20f with a space inbetween the fins 18f and 20f. Suitable spacers may be provided to maintain the gas passageways.

While some of the compactness of the early embodiments has been traded off, the heat sink 10f will still allow approximately 25% substrate coverage by semiconductor components. In one experimental test using a heat sink 10f having a 1.2×1.0 cm heat sink base with a height of 1.2 cm using 10 mil thick copper fins 18f and 20f spaced on alternate 10 mil and 20 mil centers, the thermal resistance of the arrangement was found to be 1.7° C. per watt at an air flow of 2 cfm and at a pressure of 0.25 inches of water. This is a very low thermal resistance for such a small pressure and air flow rate and such results are highly unexpected in view of previous prior art results. Such an embodiment was operated with a simple, inexpensive low power (10 watt) tube-axial fans, such as fans manufactured by EG & G Rotron under the trademark "Muffin Fan". Furthermore, the noise generated by a single heat sink 10f was less than 50 dBA.

Figure 19:
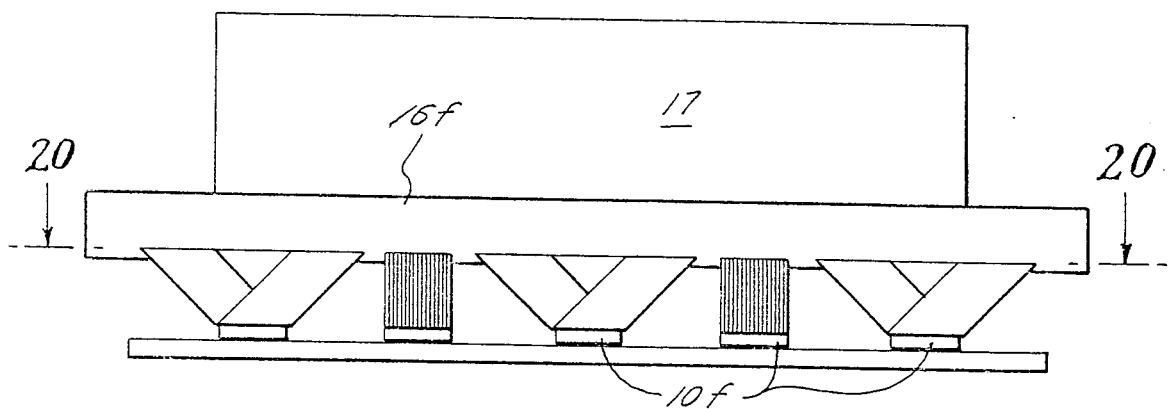
FIG. 19 is an elevational view of a plurality of heat sinks of FIGS. 17 and 18 arranged in a cooling array.
Figure 20:
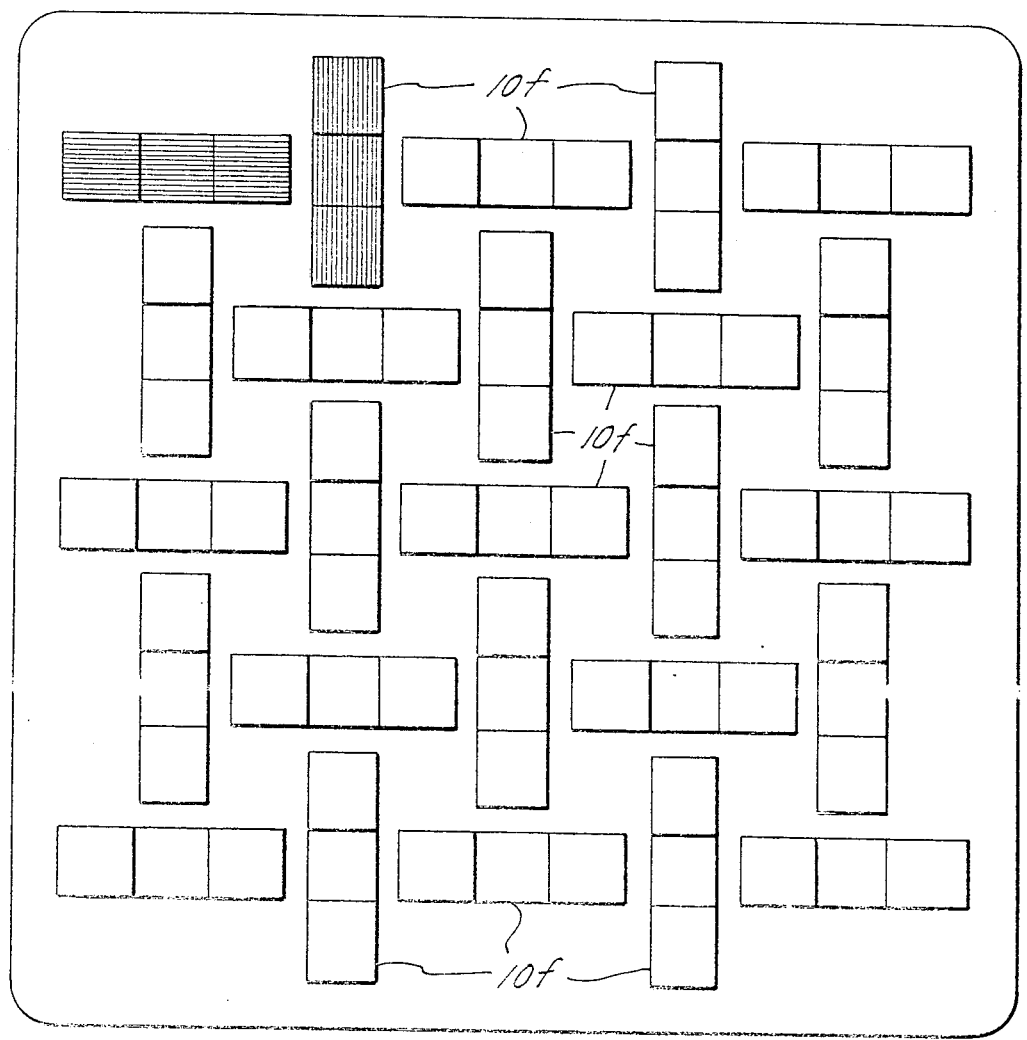
FIG. 20 is a cross-sectional view taken along line 20—20 of FIG. 19.

Traditionally, air cooling was fairly inefficient in making only partial use of the cooling potential of air by simply blowing the air around heat sinks with an open fin structure. As best seen in FIGS. 19 and 20, the heat sinks described in FIGS. 17 and 18 have been arranged in an array to provide a very efficient, low pressure, and low noise air cooling system. By containing the air flow in a plenum 16f and forcing all of the air to flow through each of the individual heat sinks 10f all of the air participates in the heat exchange and creates a highly efficient cooling system. For example, by arranging a 5×5 array of heat sinks 10f in a design best seen in FIG. 20, an experiment shows that 25 simulated chips with a total power dissipation of more than 600 watts could be cooled with a small fan 17 which dissipates only about 10 watts and generates hardly any noise. For this power dissipation of about 25 watts per chip, the temperature rise between the bottom of the heat sink and the inlet air was less than 50° C. The substrate coverage was 16% in this experiment which was cooling 25 watts per square inch at the module level. The approximate dimensions of the air cooled system of FIG. 19 are 15×15×6.5 cm. This structure was able to cool roughly 500 watts per liter. This air cooled performance is only matched by the present state of the art liquid cooled modules.

The particular basket weave layout, shown in FIG. 20, advantageously positions the bases of the heat sinks 10f an equal distance apart. This is done by positioning the bottom or base of the heat sinks 10f perpendicular to adjacent heat sinks 10f.

While the direction of air flow between the top and sides may be in either direction, it was found preferable to have the fan pull the air through the sides and out the top of the heat sinks 10f and into the plenum. This design enables the cooling of multi-chip substrates by connecting the heat sinks 10f in parallel to a plenum which directs cool air through each of the heat sinks in parallel. Consequently, the heated exhaust air from any heat sink does not affect any other heat sinks. The heat sink volume of the heat sinks 10 of FIGS. 1-3 is less than 1 cubic centimeter. Utilizing the heat sinks 10 in an array, up to 33% substrate coverage by chips has been achieved without a performance degradation. On the other hand, the heat sinks 10f of FIGS. 17 and 18 offer a similar thermal performance but at a much reduced pressure requirement. The pressure requirements of the heat sinks of 10f have been reduced by sacrificing compactness, thereby resulting in a somewhat bigger heat sink of about 3 cubic centimeter which limits the substrate coverage to about 25%.

The heat sink 10f of has the same modular advantage as the heat sink 10 and can be scaled to smaller or larger chip power heat dissipation by removing or adding fin pairs. Additionally, like the heat sink 10, the heat sink 10f may be connected to each chip without requiring a conventional compliant interface, which is a rather poorly conducting interface, between the chips and the heat sinks where the heat flux densities are highest.

The various embodiments described above generally embody the basic ideas of using a plurality of thin fins and narrow gas cooling passageways which extend between the top of the heat sink and lateral ends between both sides of the heat sink. The advantages of these structures lie in using the same structure to both duct the gas normally to the inlet direction while providing heat transfer at the same time. Each of the different embodiments has advantages of their own and different versions may be preferred for different applications.

The present invention, therefore, is well adapted to carry out the objects and attain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

What is claimed is:

1. The method of forming fins for a gas heat exchanger for heating or cooling an object comprising,
   cutting a plurality of right-angle triangle shaped fins out of a thermally conductive metal with adjacent fins being connected adjacent corresponding sides of each fin,
   folding the tip of each of said triangular shaped fins opposite its connected side over and against its fin, and
   folding adjacent fins along their connection to each other towards each other in a direction whereby adjacent fins are reversed relative to each other.

2. The method of forming a heat sink for cooling an electronic package comprising,
   removing material from one side of a solid piece of thermal conductive material at a plurality of spaced first positions leaving a cross-sectional area having a bottom, a top, and a side which extends downwardly and outwardly from the top to the bottom, and
   removing material from the side opposite the one side at a position between each of the plurality of first positions to leave a second cross-sectional area similarly shaped to the first cross-sectional area but reversed.

3. The method of forming fins for a gas cooled heat sink for cooling an electronic package comprising,
   forming a parallelogram shaped fin having one side approximately forty five degrees relative to an adjacent side, and
   folding the fin in the middle to form double fins positioned adjacent to each other but extending from the middle in opposite directions to each other.

4. The method of claim 3 including leaving a space between the doubled fins after folding.

* * * * *